(12) United States Patent
Fusco et al.

(10) Patent No.: US 7,289,573 B2
(45) Date of Patent: Oct. 30, 2007

(54) MODULATOR/TRANSMITTER APPARATUS AND METHOD

(75) Inventors: Vincent Francis Fusco, Belfast (GB); Thorsten Brabetz, Carrickfergus (GB)

(73) Assignee: The Queens University of Belfast, Belfast (GB)

( * ) Notice: Subject to any disclaimer, the term of this patent is extended or adjusted under 35 U.S.C. 154(b) by 386 days.

(21) Appl. No.: 10/505,692

(22) PCT Filed: Feb. 26, 2003

(86) PCT No.: PCT/GB03/00842

§ 371 (c)(1), (2), (4) Date: Aug. 25, 2004

(87) PCT Pub. No.: WO03/075529

PCT Pub. Date: Sep. 12, 2003

(65) Prior Publication Data

US 2005/0152469 A1 Jul. 14, 2005

(30) Foreign Application Priority Data

Mar. 6, 2002 (GB) .............. 0205199.3

(51) Int. Cl.
*H04L 27/00* (2006.01)
*H04L 5/12* (2006.01)
*H04L 27/10* (2006.01)
*H04L 27/36* (2006.01)

(52) U.S. Cl. .............. 375/295; 375/261; 375/279; 375/298

(58) Field of Classification Search .............. 375/295, 375/308, 261, 279, 298
See application file for complete search history.

(56) References Cited

U.S. PATENT DOCUMENTS

| 4,196,381 | A | * | 4/1980 | Standing .............. 323/350 |
| 5,021,753 | A | * | 6/1991 | Chapman .............. 332/103 |
| 5,497,509 | A | * | 3/1996 | Lautzenhiser et al. ...... 455/208 |
| 5,694,093 | A | * | 12/1997 | DaSilva et al. .............. 332/103 |
| 5,832,027 | A | * | 11/1998 | Ishigaki .............. 375/149 |
| 5,894,496 | A | * | 4/1999 | Jones .............. 455/126 |
| 5,963,852 | A | * | 10/1999 | Schlang et al. .............. 455/76 |
| 6,115,411 | A | * | 9/2000 | van Driest .............. 375/130 |
| 6,272,336 | B1 | * | 8/2001 | Appel et al. .............. 455/423 |
| 6,555,440 | B1 | * | 4/2003 | Geefay .............. 438/328 |
| 6,560,296 | B1 | * | 5/2003 | Glas et al. .............. 375/308 |
| 6,631,254 | B1 | * | 10/2003 | Wilson et al. .............. 455/91 |

(Continued)

FOREIGN PATENT DOCUMENTS

EP 0716526 6/1996

*Primary Examiner*—Mohammed Ghayour
*Assistant Examiner*—Nurul M Matin
(74) *Attorney, Agent, or Firm*—Drinker Biddle & Reath LLP

(57) ABSTRACT

Method and apparatus for providing an amplified modulated radio frequency signal, the method comprising the steps of providing a radio frequency (RF) oscillatory signal, generating from the RF oscillatory signal and an input signal a pair of phase modulated phase conjugated signals, and summing the pair of signals to provide the desired modulated RF signal output. A form of the invention is applied to digital modulation using in-phase (I) and quadrature (Q) input signals. Each of the I and Q signals is processed in a respective channel, with the channel outputs being summed. The channels share an RF oscillatory signal, which is phase shifted by 90 degrees within the Q channel.

30 Claims, 8 Drawing Sheets

U.S. PATENT DOCUMENTS 6,731,917 B1 * 5/2004 Krishna ...................... 455/205
2001/0016016 A1   8/2001 Eidson et al.
2003/0223480 A1 * 12/2003 Cafarella .................... 375/219
2006/0135082 A1 *  6/2006 Cook .......................... 455/73

* cited by examiner

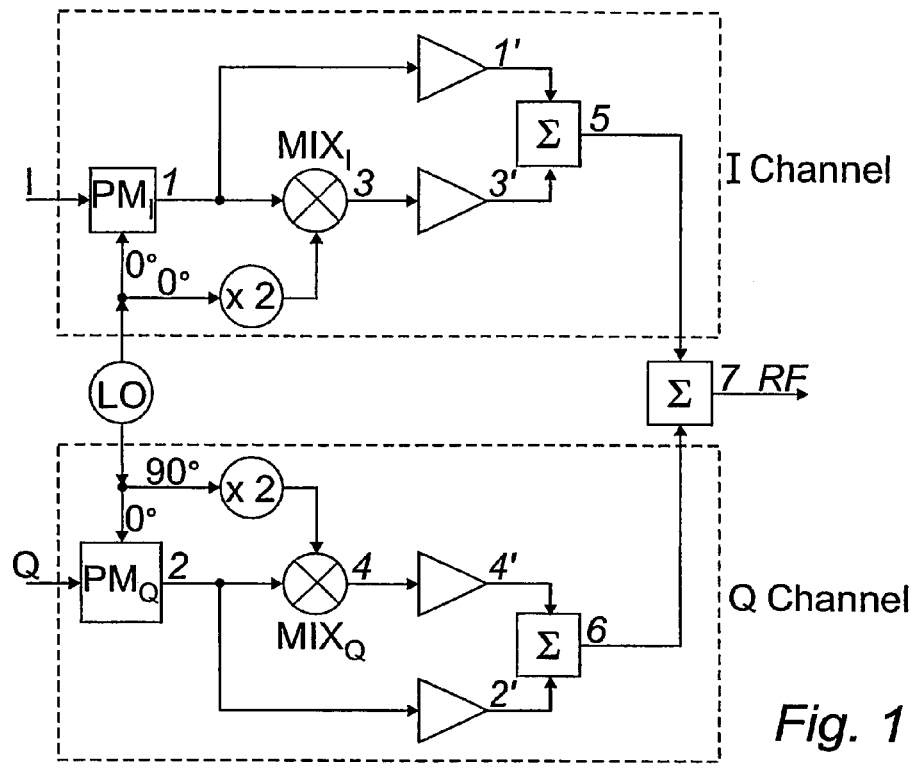
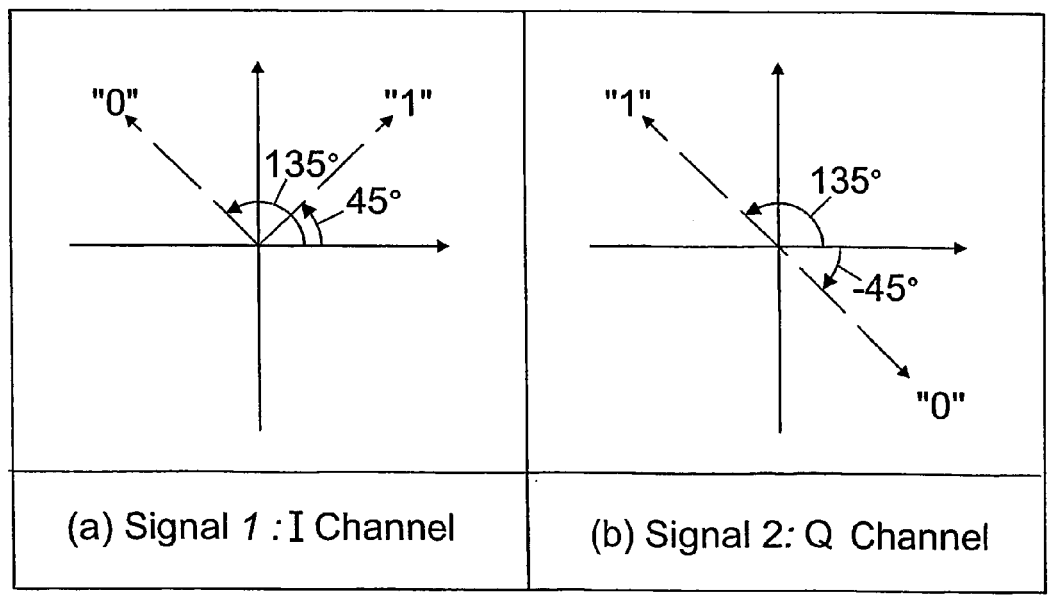
Fig. 2

MODULATOR/TRANSMITTER APPARATUS AND METHOD

This invention relates to radio frequency modulation and transmission. The invention is particularly, but not exclusively, useful in handling digital radio signals such as those used in mobile phone systems.

One problem for all mobile phone manufacturers is the inability of the industry and the national standardisation authorities to define global regulations regarding the modulation schemes for mobile communications. As a consequence, to date a single transmitter type cannot be truly "global". Therefore, the current design philosophy is to build mobile phones that contain multiple transmitters, whereby only the part that complies with the local modulation scheme is activated. The alternative is to have mobiles that work only in a limited geographic region. This however is costly and results in bulky and/or heavy mobiles and/or unsatisfied customers who find their handsets unusable when going aboard. It also means that whenever modulation schemes have to be changed to incorporate technical changes, e.g. during the transition from the 2 G to 3 G networks, old equipment becomes obsolete.

Consequently, the industry has tried for quite some time to develop "software radios". A software radio contains only standard components that can reconfigure themselves on request of the controlling software, hence adapt the transmitter to comply with the relevant technical requirements. The problem is particularly acute at the modulator, up converter, amplification chain. However, attempts so far have not led to any major breakthrough because they were based on modifications to a classic superheterodyne transmitter, i.e. keep the traditional transmitter topology (modulation specific baseband modulators followed by up converters followed by the linear power amplifiers, necessary to preserve digital data modulation characteristic integrity),e.g. [1].

The present invention resides in a method for providing an amplified modulated radio frequency signal, the method comprising:

providing a radio frequency (RF) oscillatory signal;
generating from the RF oscillatory signal and an input signal a pair of phase modulated phase conjugated signals; and
summing said pair of signals to provide the desired modulated RF signal output.

Said pair of signals may be produced by modulating said RF oscillatory signal with the input signal to provide a modulated RF signal, and combining the modulated RF signal with a multiple of the RF oscillatory signal to provide a composite signal.

Preferably, each of the modulated RF signal and the composite RF signal is separately amplified before being combined with the other. For best DC to RF efficiency amplification may be non-linear.

Preferably, said multiple is 2, and may be produced from the oscillatory signal by a frequency multiplier, or by use of a harmonic mixer.

In one form of the invention, the input signal is an analogue signal and said modulation is an analogue phase shift. The result of the summation is an amplitude modulated RF signal. Optionally, the amplitude modulated signal may be further summed with said oscillatory RF signal to provide a frequency modulated RF signal.

More significantly, however, another form of the invention is applied where the input signal comprises in-phase (I) and quadrature (Q) input signals, which are digitally modulated. Each of the I and Q signals is processed in a respective channel by the foregoing method, the channel outputs being summed. The channels share an oscillatory RF signal, which is phase shifted by 90 degrees within the Q channel.

From another aspect, the invention provides a modulator for generating a modulated RF signal, the modulator comprising:

a local oscillator generating an RF oscillatory signal;
means for producing, from said RP oscillatory signal and an input signal, a pair of phase modulated phase conjugated signals; and
a summing circuit receiving said pair of signals as inputs to generate a modulated RF output signal as its output.

Said means for producing a pair of phase modulated phase conjugated signals typically comprises a modulator arranged to modulate said RF oscillatory signal with the input signal to provide a modulated RF signal, and a mixer connected to mix said modulated RF signal with a multiple of the RF oscillatory signal to provide a composite signal.

Preferably, a first amplifier is connected between the mixer output and a respective input of a first summer, and a second amplifier is connected between the modulator output and a respective input of a first summer.

The mixer may be a fundamental mixer and may receive the local oscillator output via a multiplier circuit, typically a doubler. Alternatively, the mixer may be a harmonic mixer connected directly to the local oscillator output.

In one form of the invention, for use with an analogue input signal, the modulator is an analogue phase shifter and the output of the summing circuit is an amplitude modulated RF signal. The modulator may include a further summer which sums the output of the first summer with the local oscillator signal to provide a frequency modulated output signal.

More typically, however, the input signal comprises in-phase (I) and quadrature (Q) input signals, which are digitally modulated. In this case, the modulator comprises an I channel and a Q channel each as defined above and sharing a common local oscillator, the outputs of the summers of the I and Q channels being combined by a third summer to provide the modulated RF output signal.

Each channel may comprise a mixer. The mixers may be fundamental mixers supplied with a frequency doubled local oscillator signal. Each channel may have its own frequency doubler, with that in the Q channel receiving the local oscillator output phase shifted by 90 degrees. Alternatively, both mixers may be supplied by a single frequency doubler, and the signal from the local oscillator to the Q channel modulator be phase shifted by 90 degrees. In a further option, the mixers may be harmonic mixers, in which case frequency doublers are not required.

In another embodiment, the means for producing the pair of phase modulated phase conjugated signals are constituted by a see-saw modulator in each channel.

The see-saw modulator may suitably use shorted lines to create the necessary phase shifts for a phase modulated signal, and the lines may be selectively shorted electronically, for example by switching of PIN diodes.

In the present invention, in contrast to the classic solutions, modulation is not performed in the baseband, but directly at the RF frequency, through the application of simple phase shifters rather than complicated IQ modulators. The in-phase and quadrature part of the signal (synthesised using phase conjugation vector summation) are modulated and amplified separately, and finally combined, to form the actual IQ modulation specific signal. This results in several advantages over the classic approach, which will be detailed below.

Embodiments of the present invention will now be described, by way of example only, with reference to the drawings, in which:

FIG. 1 is a schematic of the system topology of one embodiment of the invention;

FIGS. 2 to 5 are phase diagrams illustrating phase states at various points in FIG. 1;

1.1 Operating Principle

Figure 3:
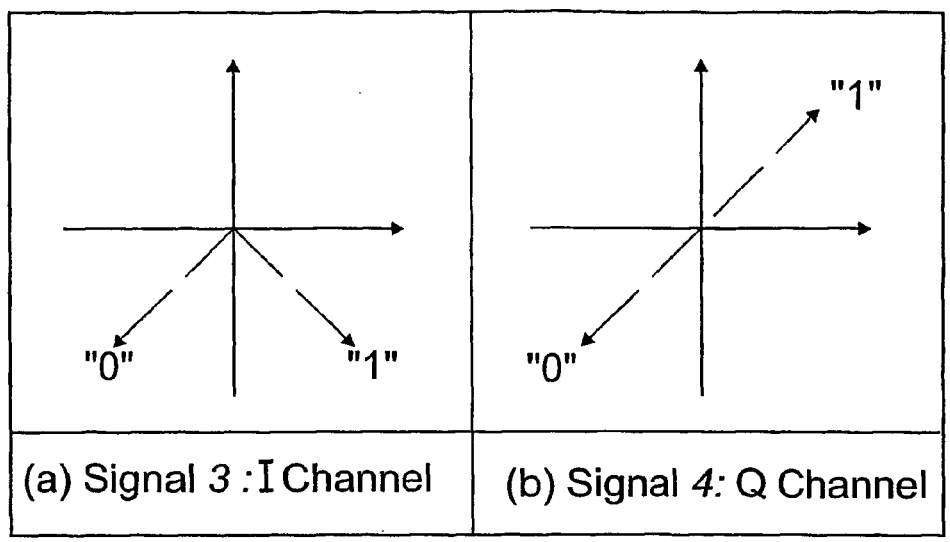

FIG. 1 shows the overall system topology of the suggested novel architecture used to produce adaptive digital modulation and RF transmission with highly efficient DC to RF amplification. The two conventional baseband input signals. I and Q, are fed to the system, and the modulated and amplified output signal, called RF, is taken from the system. The system requires a single local oscillator (LO), which can be derived in the usual way, e.g. from a phase locked loop frequency synthesiser.

The purpose of the transmitter shown in FIG. 1 is to produce an amplified RF output signal with a pre-specified digital modulation scheme applied to it. For the purpose of introductory explanation of the working principle, it is assumed that quadrature phase shift keyed modulation, QPSK [11], of the baseband signals is to be synthesised and transmitted on an RF carrier.

1.1.1 The Phase Modulation Stage

The two baseband input signals I and Q, here assumed to be digital, are each fed to the phase setting control port of a phase modulator, designated here $PM_I$ and $PM_Q$, respectively, FIG. 1. The LO signal, at the requisite carrier frequency, is fed to the input ports of the phase modulators and a phase shift is applied to it as determined by the logic state of the I,Q bit pattern applied. A 90° phase shift is introduced in the quadrature channel with respect to the in-phase channel. Consequently, the output signal of each of the phase modulators will vary between two discrete phase states.

To achieve QPSK, one possible set of output phase states is 45° and 135° for signal 1, and 135° and −45° for signal 2, respectively, FIG. 1. The two signals are shown in FIG. 2. These phase states are obtained by using simple software or analogue to digital hardware to select the appropriate phase shifts through phase modulators $PM_I$, $PM_Q$.

Signals 1 and 2 are then split in to equal strength signal paths, of which one is directly amplified. This results in the signals 1' and 2', receptively. The other signals are each fed to separate RF balanced mixers, called $MIX_I$ and $MIX_Q$.

1.1.2 The Phase Conjugation Stage

The LO signals for mixers $MIX_I$, $MIX_Q$ are derived from the original carrier signal by frequency doubling it. Hence, the LO signal applied to the mixers is phase locked to the initial carrier signal, and will introduce a constant phase shift into the IF output signal of these mixers. The LO signal for mixer $MIX_Q$ is derived from the initial carrier signal after a 90° phase shift has been applied. This introduced phase shift is then doubled to become 180° at mixer $MIX_Q$.

Although not a pre-requisite for operation, double balanced mixers are used for $MIX_I$ and $MIX_Q$, since these naturally suppress unwanted leakage signals. The difference signal will have a frequency equal to the initial carrier frequency, because the LO signal is exactly twice the RF signal. Furthermore, it is an inherent property of the difference signal that its phase is conjugated with respect to the RF input signal. It is this property that allows direct synthesis of the digital modulation schemes.

Hence, additional phase states of the IF output signals after this mixing process occurs become available. These result from the fact that the phase of the lower sideband after the mixing process is conjugated with respect to the input signal, i.e a phase of φ(t) for the lower sideband output signal. For example, if the phase of the LO signal is assumed to be 0°, and the phase of the RF signal say from $MIX_I$ in FIG. 1 is φ, then Signal 3 at the output from $MIX_I$ will be $$\cos(2\omega_{LO}t+0°)\cos(\omega_{LO}t+\phi)$$

i.e ½ $\cos(3\omega_{LO}t+\phi)$ and ½ $\cos(\omega_{LO}t-\phi)$

The up-converted term can be suppressed by the amplifier frequency response, while the down converted term contains the wanted conjugate phase of the RF phase shifted signal. Hence, the phase states in FIG. 2 become phase conjugated to those in FIG. 3, i.e. −45° and −135° for signal 1, and 45° and −135° for signal 2. Note that in the latter case, the signal has an additional phase shift of 180° due to the introduced LO phase shift. Consequently, the phase states of signals 3 and 4 are as shown in FIG. 3.

Finally, the phase conjugated signals are amplified, resulting in signals 3' and 4', respectively, these are then combined after suitable power factor correction with a non-conjugated signals 1' and 2', respectively, see section 1.1.3. Thus, an RF output signal which has the appropriate modulation scheme applied, has been amplified and set for transmission. Note here that, since the I, Q bit patterns have been converted to PM modulated constant amplitude signals, highly efficient non-linear amplification can be used without deteriorating the properties of the modulated signal being transmitted.

1.1.3 The Combination Stages

Figure 4:
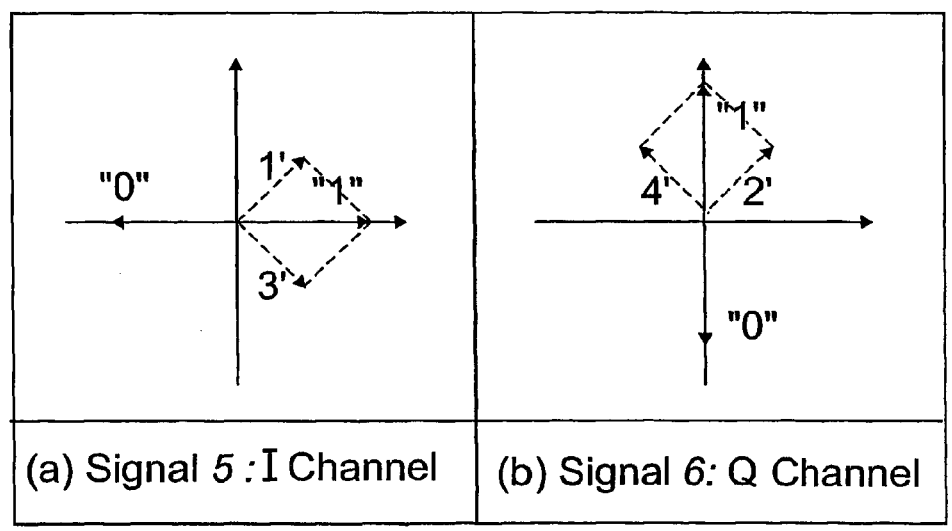
Figure 5:
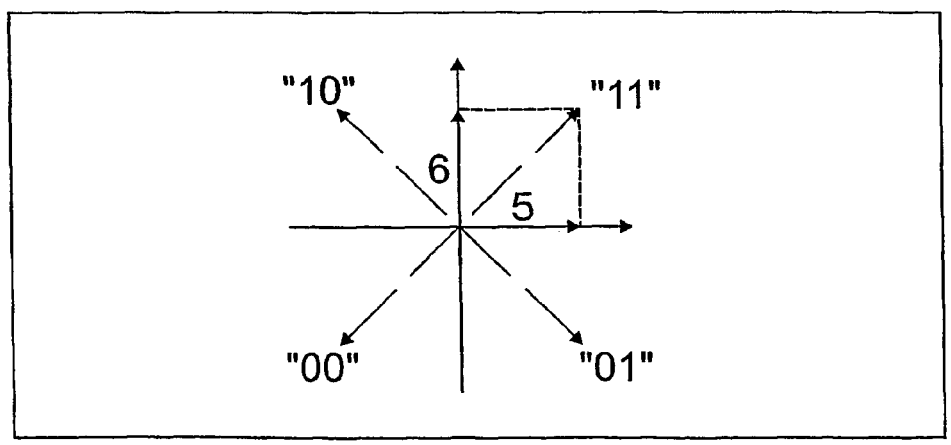

In the first step, signal 1' is vectorially combined with signal 3', and signal 2' with signal 4', the resulting output signals, 5 and 6, are shown in FIG. 4. It can be seen that the two signals are now in quadrature with respect to each other. When these signals are vectorially combined in the final combination stage, we achieve the wanted QPSK signal, FIG. 5.

1.1.4 Properties of Amplifier

It is important to note here that not only have we created a vector modulator based on simple phase shifters using a phase conjugation philosophy, but also as an additional benefit we have created a situation whereby we can use highly non-linear (i.e DC to RF efficient) amplifiers, because the RF signal is of constant amplitude during amplification.

The principle of converting an amplitude modulated signal into a phase modulated one during amplification was first reported by Cox in 1974 [2]. However, Cox generated his constant amplitude signal only after the up conversion, on the RF frequency and within the amplifier. His idea had therefore the severe disadvantage of resulting in a very high count of very complex and technically challenging components used to generate the AM to PM conversion requisite for the technique to work. In addition, adaptive modulation as a wanted artefact of the AM to PM conversion was not addressed. Our improvements, to firstly generate the constant amplitude signals during the modulator process, and second, the use of quadrature signals to achieve any given digital modulation scheme without changes to the hardware, results in a far more flexible and simpler system.

1.2 Alternative System Topologies

1.2.1 System for use with Fundamental/Harmonic Mixers

The system topology as shown in FIG. 1 was chosen, because the mixers $MIX_I$ and $MIX_Q$ ultimately can be replaced by harmonic mixers [3], making the need for frequency doublers redundant.

Figure 6:
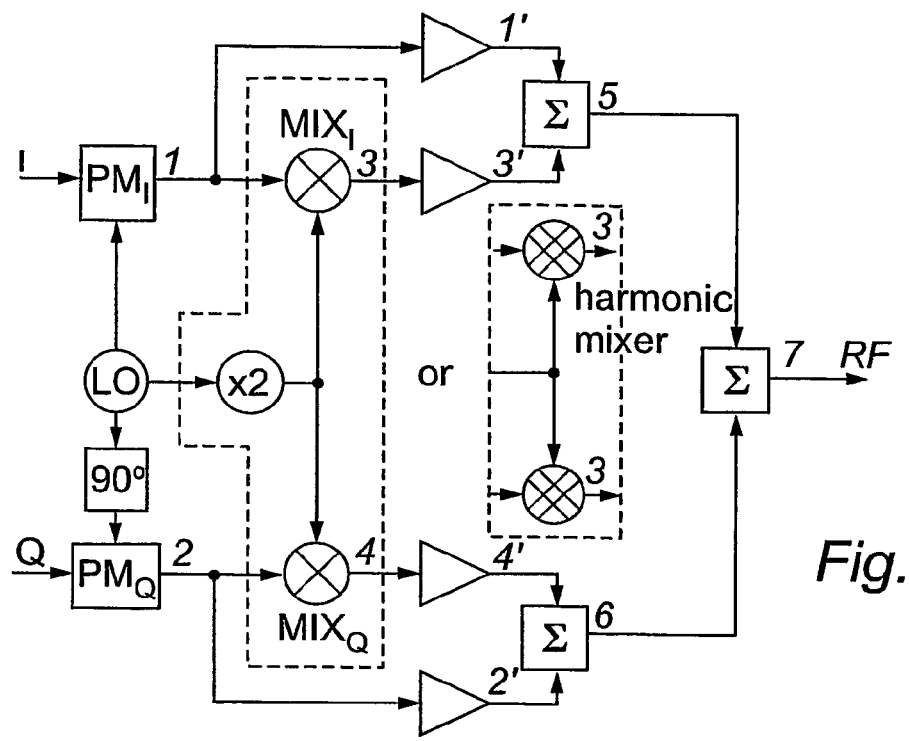
FIG. 6 is a schematic of a second embodiment, also indicating a modification thereof.

However, should harmonic mixers not be chosen due to their inherently lower conversion gain, another simplification to reduce component count for the system is shown in FIG. 6. Here, the required phase shift to bring the Q channel in quadrature to the I channel is not added to the LO signal at the mixer $MIX_Q$, but directly inserted on the carrier before it is fed to the phase modulator, $PM_Q$. It could also be inserted at any other point in the Q path, but this position shown was chosen because there is no modulation present, which means that the phase modulator does not have to exhibit significant bandwidth performance other than required for the LO in a multichannel situation.

A further modification could be to replace power factor corrected combiner 7 with a spatial power combiner, i.e by feeding to a multiport antenna or an array of antennas [4].

1.2.2 System Using See-Saw Modulator

Figure 7:
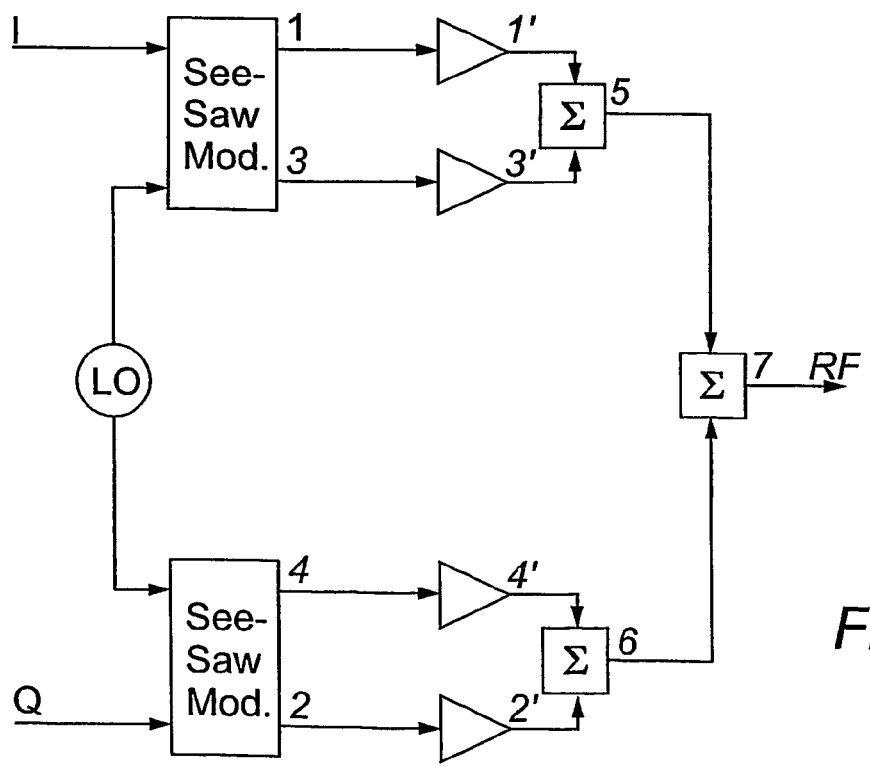
FIG. 7 shows a further embodiment.

A very simple way to create phase conjugated phase modulated signals is by using a See-Saw modulator. The See-Saw modulator uses the reflections at shorted lines to create the necessary phase shifts for a discrete phase modulated signal. The essential property of the See-Saw modulator is that the output from port 1, in FIG. 7 is the phase conjugate of that coming from port 3. The different phase shifts from different phase states are achieved by shorting the lines at different discrete points using PIN diodes as switches. The actual combination of PIN open and short circuit states needed to fulfill the phase states necessary for each digital modulation type, Section 2, would be determined by simple hardware or software logic. However, it is obvious that therefore only discrete phase states can be realised, and the number of possible phase states is predetermined by the number of PIN diodes integrated into the system, and can no longer be changed after the system has been manufactured. Also, there is of course no analogue modulation possible. A detailed description of the modulator can be found in [5].

Using the See-Saw modulator to directly modulate the RF carrier, leads to significant simplifications in the system, as there is no longer a need to create an LO signal of twice the RF frequency. The modified system can be seen in FIG. 7.

The main advantage of this system over the one introduced in Section 1.1 is the very simple set-up, which allows to adopt any given modulation scheme just by switching PIN diodes according to a preset scheme, which could for example be stored in a look-up table. Also, having eliminated the need for the LO signal of twice the RF frequency, the requirement for one, or two frequency doublers, respectively, and for the two balanced mixers has been removed, significantly simplifying the system.

2 Utility of System with Other Modulation Schemes

2.1 BPSK [11]

2.1.1 Classic Phase State Arrangement

Figure 8:
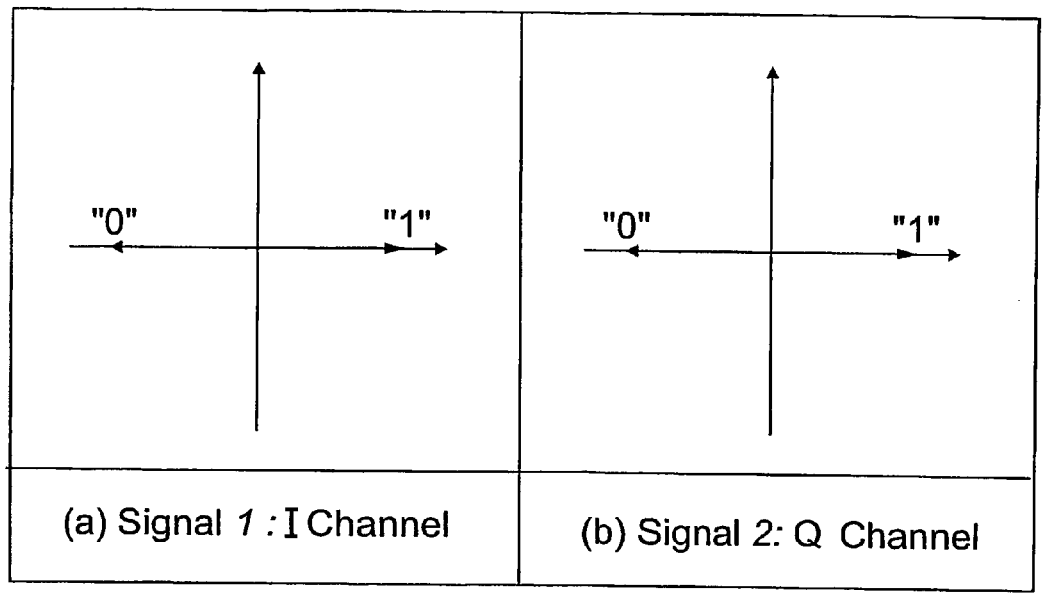
FIGS. 8 to 12 are phase diagrams illustrating the system of FIG. 1 operating in other modulation schemes.
Figure 10:
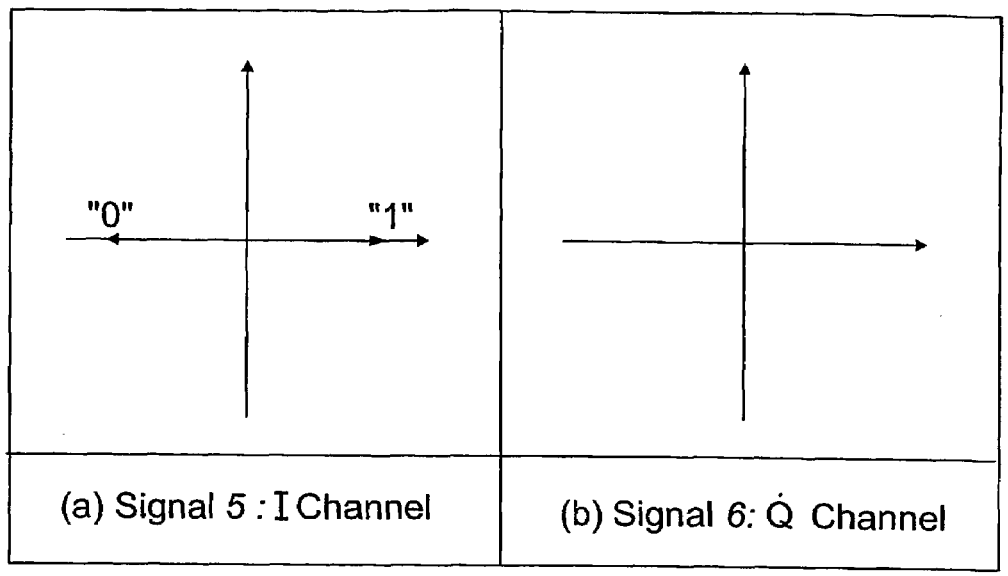

For classic BPSK, only the I signal is used, the Q-Port is not required, but included here for uniformity of presentation with more complex modulation schemes. In order to synthesise the desired output phase states, the phase shifters are both set to switch between 0° and 180°, the two classic phase states for BPSK. Consequently, the phase modulated signals (Signals 1 and 2, FIG. 10) look like those shown in FIG. 8 if I, Q bit streams are made the same.

Figure 9:
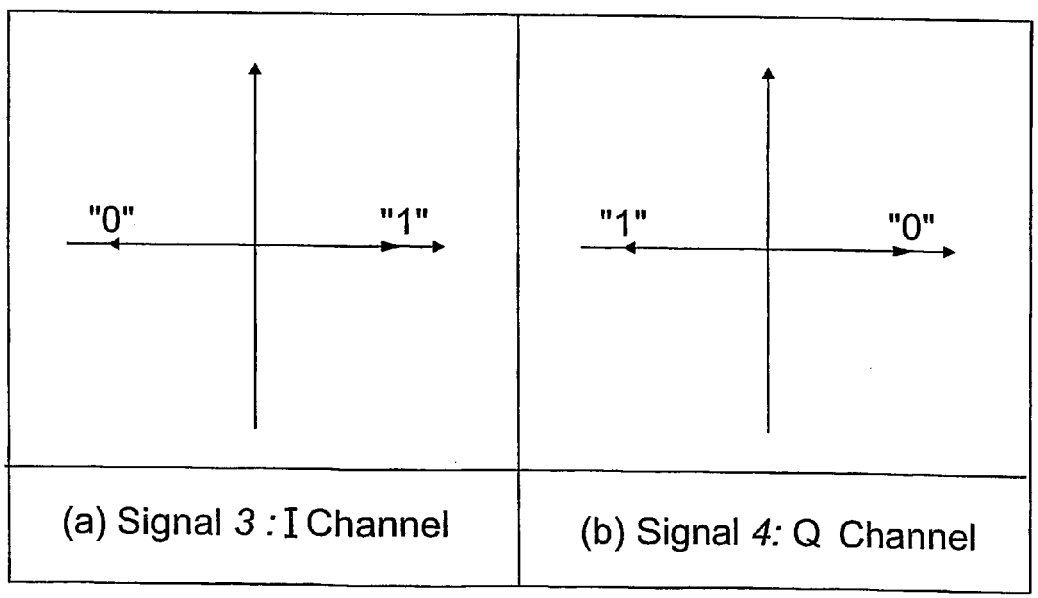

As a phase of 0° is identical to its conjugated phase −0°, and similarly a phase of 180° is identical to −180°, Signals 3 and 1 look identical. Due to the additional 180° phase shift experienced by Signal 4, it is the exact mirror of Signal 2, as seen in FIG. 9.

Signals 1 and 3 are exactly in phase with each other. Hence, on combination in the first combination phase, Signal 5 will be exactly the same, only amplified. Signals 2 and 4 on the other hand are exactly in antiphase and will negate each other on combination. Hence, there will be no Signal 6 present, (see FIG. 10).

Figure 11:
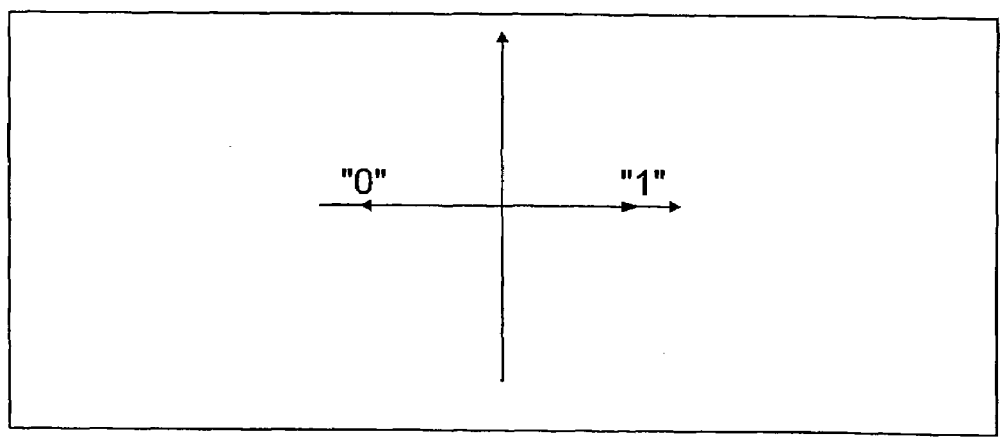

Finally, when Signals 5 and 6 are combined, they result in the output Signal 7 which is identical to Signal 5 due to the lack of Signal 6, as in FIG. 11.

The resulting phase states of the phase modulator are given below.

TABLE 1

Phase States of the Phase Modulator for BPSK

| I | $PM_I$ O/P Phase State | Q = I | $PM_Q$ O/P Phase State |
|---|---|---|---|
| 0 | 180° | 0 | 180° |
| 1 | 0° | 1 | 0° |

2.1.2 Modified Phase State Arrangement

The arrangement described in Section 2.1.1 has the disadvantage that a whole branch is energised but its output is not efficiently used, as signal 2' and 4' are cancelled upon recombination. This is at best a waste of available hardware, and if the branch cannot be turned off, it will continue to consume energy and hence reduce transmitter efficiency.

The initial phase states can be chosen arbitrarily. This feature can be used to set the output power level from the system without having to adjust the amplifiers away from their maximum power added efficiency operating point. For example by choosing 45° for the phase state representing a binary "1", and −135° to represent a binary "0" respectively, the topology can work with maximum efficiency for this modulation scheme. This aspect is not discussed further.

2.2 QPSK [1]

The case of QPSK has been dealt with in section 1.1. Here, only the phase table is given:

TABLE 2

Phase States of the Phase Modulator for QPSK

| I | $PM_I$ O/P Phase State | Q | $PM_Q$ O/P Phase State |
|---|---|---|---|
| 0 | 135° | 0 | −45° |
| 1 | 45° | 1 | 135° |

2.3 Offset-QPSK or OQPSK [11]

OQPSK is a special case of QPSK. The phase state diagram is exactly identical to QPSK, but the I and Q signal are never allowed to change simultaneously, i.e the difference between the two modulation schemes is only visible in the time domain. To prevent the I and Q signal from changing simultaneously, both are allocated different timeslots in which they are allowed to vary, so that even if both I and Q are required to change, they do so after each other. This way the output vector will never pass through the origin of the phase diagram, meaning that the output signal will never drop to zero. As in every other respect, OQPSK is completely identical with QPSK, all the derivations made in the relevant sections are applicable to OQPSK.

TABLE 3

Phase States of the Phase Modulator for OQPSK

| I | $PM_I$ O/P Phase State | Q | $PM_Q$ O/P Phase State |
|---|---|---|---|
| 0 | 135° | 0 | −45° |
| 1 | 45° | 1 | 135° |

2.4 The Higher-Order Digital Modulation Schemes

2.4.1 Relationship Between Input and Output Phase

Because of the major number of possible phase states, 8-PSK is no longer dealt with by showing the diagrams for each case, but instead a general formula for the input phases in dependence of the output is derived, and a table of all phase states created using this formula. The same formula will also be used to derive the phase state tables in all of the following sections.

Figure 12:
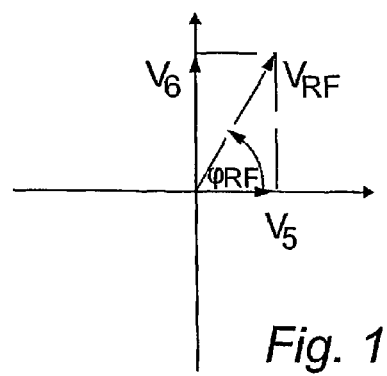

To start, the required output RF Signal, Signal 7, $V_{RF}$ in FIG. 12. The phase angle, $\phi_{RF}$, can take any value out of range from −180° to +180°, with VRP being the amplitude of the RF signal.

The RF signal is made up of two signals that are orthogonal to each other, but which in general can have different amplitude, namely Signal 5 and Signal 6. Working back from the required amplitude and phase relationships required for $V_{RF}$, their amplitudes can be derived through trigonometric calculations as:

$$V_5 = V_{RF} \cos(\phi_{RF}) \quad (1)$$

$$V_6 = V_{RF} \sin(\phi_{RF}) \quad (2)$$

Signals $V_5$ and $V_6$ again are themselves created through the summation of phase conjugated signal pairs, namely Signals 1 and 3 in case of $V_5$, and Signals 2 and 4 in case of $V_6$. In addition to being phase conjugated in the arrangement in FIG. 1 (used here for discussion as a means of realisation), Signals 2, 4 also receive a 180° phase shift with respect to the LO (see FIG. 1). Next, since Signals 1 and 3 as well as Signals 2 and 4 are phase conjugated, and V1=V3, V2=V4, then $\phi_1 = -\phi_3$, and finally $180° - \phi_2 = -\phi_4$, respectively, is used to derive the output signals after the phase modulators PM1 and PM2:

$$V_5 = 2 \cdot g \cdot V_1 \cdot \cos(\phi_1) \quad (3)$$

$$V_6 = 2 \cdot g \cdot V_2 \cdot \sin(\phi_2) \quad (4)$$

Where g is the total gain provided by each amplifier pair.

Equation (1) is inserted in equation (3), and equation (2) is inserted in equation (4), respectively. The resulting equations are solved for the required phases $\phi_1$ and $\phi_2$ required at $PM_1$ and $PM_Q$ respectively, FIG. 1 obtained. These represent the wanted relationship between necessary input signal phases with respect of the desired RF signal phase needed to synthesise any particular digital modulation scheme.

$$\varphi_1 = -\arccos\left(\frac{V_{RF} \cdot \cos(\varphi_{RF})}{2 \cdot g \cdot V_1}\right) \quad (5)$$

$$\varphi_2 = -\arcsin\left(\frac{V_{RF} \cdot \sin(\varphi_{RF})}{2 \cdot g \cdot V_2}\right) \quad (6)$$

These equations can now be used to set up the tables of phase states for the higher-order modulation schemes.

2.4.2 8PSK[11]

An 8 PSK signal consists of tribits, i.e. each word is made up of three bits, I, Q, and C. Hence, the signal takes one out of 8 possible phase states, each with a constant amplitude. Table 4 has been created using the equations (5) and (6), and under the assumptions of $$V_{1,2} = \frac{V_{RF}}{2 \cdot g}.$$

It shows the output phase $\phi_{RF}$, and the two required input phases, $\phi_1$ and $\phi_2$, for each of the input bits combinations. To summarise the table, both phase modulators, $PM_1$ and $PM_Q$ have to create the same phase as required for the output signal.

TABLE 4

8psk Phase States

| I | Q | C | $\phi_{RF}$ | $\phi_1$ | $\phi_2$ |
|---|---|---|---|---|---|
| 0 | 0 | 0 | −112.5° | −112.5° | −112.5° |
| 0 | 0 | 1 | −157.5° | −157.5° | −157.5° |
| 0 | 1 | 0 | −67.5° | −67.5° | −67.5° |
| 0 | 1 | 1 | −22.5° | −22.5° | −22.5° |
| 1 | 0 | 0 | +112.5° | +112.5° | +112.5° |
| 1 | 0 | 1 | +157.5° | +157.5° | +157.5° |
| 1 | 1 | 0 | +67.5° | +67.5° | +67.5° |
| 1 | 1 | 1 | +22.5° | +22.5° | +22.5° |

2.4.3 16 PSK [11]

For 16 PSK each word consists of four bits, I, Q, $C_1$ and $C_2$. Hence, the signal takes one out of 16 possible phase states, but has constant amplitude. The following table has been created using the equations (5) and (6), and under the assumptions of $$V_{1,2} = \frac{V_{RF}}{2 \cdot g}.$$

It shows the output phase $\phi_{RF}$, and the two input phases, $\phi_1$ and $\phi_2$, for each of the input bits comminations. To summarize the table, both phase modulators, $PM_1$ and $PM_Q$ have to create the same phase as required for the output signal.

| I | Q | C1 | C2 | $\phi_{RF}$ | $\phi_1$ | $\phi_2$ |
|---|---|---|---|---|---|---|
| 0 | 0 | 0 | 0 | 11.25° | 11.25° | 11.25° |
| 0 | 0 | 0 | 1 | 33.75° | 33.75° | 33.75° |
| 0 | 0 | 1 | 0 | 56.25° | 56.25° | 56.25° |
| 0 | 0 | 1 | 1 | 78.75° | 78.75° | 78.78° |
| 0 | 1 | 0 | 0 | 101.25° | 101.25° | 101.25° |
| 0 | 1 | 0 | 1 | 123.75° | 123.75° | 123.75° |
| 0 | 1 | 1 | 0 | 146.25° | 146.25° | 146.25° |
| 0 | 1 | 1 | 1 | 168.75° | 168.75° | 168.75° |
| 1 | 0 | 0 | 0 | −168.75° | −168.75° | −168.75° |
| 1 | 0 | 0 | 1 | −146.25° | −146.25° | −146.25° |
| 1 | 0 | 1 | 0 | −123.75° | −123.75° | −123.75° |
| 1 | 0 | 1 | 1 | −101.25° | −101.25° | −101.25° |
| 1 | 1 | 0 | 0 | −78.75° | −78.75° | −78.75° |
| 1 | 1 | 0 | 1 | −56.25° | −56.25° | −56.25° |
| 1 | 1 | 1 | 0 | −33.75° | −33.75° | −33.75° |
| 1 | 1 | 1 | 1 | −11.25° | −11.25° | −11.25° |

2.4.4 8 QAM [11]

An 8 QAM signal consists of tribits, i.e word consisting of three bits, I, Q, and C. The signal takes one out of 4 possible phase states, while the last bit, C, determines the amplitude. The following table has been created using the equations (5) and (6), and under the assumptions of $$V_{1,2} = \frac{V_{RF}}{2 \cdot g}$$

for C=1. For C=0, the output amplitude $V_{RF,O}$ is only 0.41 $V_{RF}$.

Hence, the calculation is based on the definition $$V_{1,2} = 0.2 \cdot \frac{V_{RF}}{2 \cdot g}.$$

Since for QAM signal not all phase state vectors have the same length, those with reduced input amplitude are synthesised purely by choosing certain input phase angles, $\phi_1$ and $\phi_2$; such that vector combination of equilength vectors at 5, 6 and subsequently at 7 in FIG. 1 lead to the correct phase/magnitude for a prescribed bit pattern. Therefore, a change of input signal amplitude is not necessary. The table shows the output amplitude, $V_{RF}$, and output phase $\phi_{RF}$, and the two required input phases, $\phi_1$ and $\phi_2$, for each of the input bits combinations.

TABLE 5

8QAM Phase States

| I | Q | C | $V_{FR}/g \cdot V^1$ | $\phi_{RF}$ | $\phi_1$ | $\phi_2$ |
|---|---|---|---|---|---|---|
| 0 | 0 | 0 | 0.41 | −135° | 98.4° | −8.4° |
| 0 | 0 | 1 | 1 | −135° | −135° | −135° |
| 0 | 1 | 0 | 0.41 | −45° | 81.6° | −8.4° |
| 0 | 1 | 1 | 1 | −45° | −45° | −45° |
| 1 | 0 | 0 | 0.41 | 135° | 98.4° | −8.4° |
| 1 | 0 | 1 | 1 | 135° | 135° | 135° |
| 1 | 1 | 0 | 0.41 | 45° | 81.6° | 8.4° |
| 1 | 1 | 1 | 1 | 45° | 45° | 45° |

2.4.5 16 QAM [11]

For an 16 QAM signal each word consisting of four bits, namely I, Q, C1, and C2. The signal takes one out of 9 possible phase states, and one of three different possible amplitudes. The following table has been created using the equations (5) and (6), and under the assumptions of $$V_{1,2} = \frac{V_{RF}}{2 \cdot g}$$

for the largest output signal amplitude, $$V_2 = 0.37 \frac{V_{RF}}{2 \cdot g}.$$

for the medium amplitude, and $$V_{1,2} = 0.13 \cdot \frac{V_{RF}}{2 \cdot g}.$$

for the small amplitude. As before for 8 QAM, the reduced input are achieved purely by choosing certain input phase angles, $\phi_1$ and $\phi_2$, which when vector added lead to the required amplitude value such that a change of input signal amplitude is not necessary. The table shows the output amplitude, $V_{RF}$, and output phase $\phi_{RF}$, and the two required input phases, $\phi_1$ and $\phi_2$, for each of the input bits combinations.

| I | Q | $C_1$ | $C_2$ | $V_{RF}/g \cdot V_{1,2}$ | $\phi_{RF}$ | $\phi_1$ | $\phi_2$ |
|---|---|---|---|---|---|---|---|
| 0 | 0 | 0 | 0 | 0.52 | −135° | 100.6° | −10.6° |
| 0 | 0 | 0 | 1 | 1.46 | −165° | 134.8° | −10.9° |
| 0 | 0 | 1 | 0 | 0.52 | −45° | 79.4° | −10.6° |
| 0 | 0 | 1 | 1 | 1.46 | −15° | 45.2° | −10.9° |
| 0 | 1 | 0 | 0 | 1.46 | −105° | 100.9° | −44.8° |
| 0 | 1 | 0 | 1 | 2 | −135° | 135° | −45° |
| 0 | 1 | 1 | 0 | 1.46 | −75° | 79.1° | −44.8° |
| 0 | 1 | 1 | 1 | 2 | −45° | 45° | −45° |
| 1 | 0 | 1 | 0 | 0.52 | 135° | 100.6° | 10.6° |
| 1 | 0 | 0 | 1 | 1.46 | 175° | 136.7° | 3.6° |
| 1 | 0 | 0 | 0 | 0.52 | 45° | 79.4° | 10.6° |
| 1 | 0 | 1 | 1 | 1.46 | 15° | 45.2° | 10.6° |
| 1 | 1 | 1 | 0 | 1.46 | 105° | 100.9° | 44.8° |
| 1 | 1 | 0 | 1 | 2 | 135° | 135° | 45° |
| 1 | 1 | 1 | 0 | 1.46 | 75° | 79.10° | 44.8° |
| 1 | 1 | 1 | 1 | 2 | 45° | 45° | 45° |

2.5 AM/FM Modulation

Figure 13:
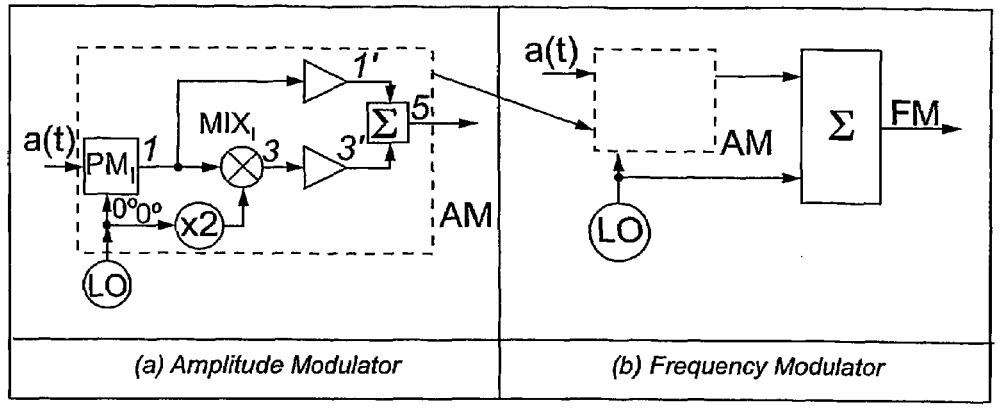
FIG. 13 shows the application of the invention in embodiments for producing AM and FM signals.

If the basic phase conjugation technique described in Section 1.1 is applied to FIG. 13(a), where a(t) is an analogue input signal and PM is an analogue phase shifter that can provide up to ±90° phase shift, then the arrangement can be made to produce an amplitude modulated (AM) RF carrier, while that in FIG. 13(b) will produce Frequency Modulation (FM) by the direct FM method [11].

3 Proof of Concept

Simulations were carried out using Hewlett Packard's Advanced Design System (ADS) [6] to simulate the circuit at a systems level; i.e. building blocks for mixers, phase shifters etc. were used to simulate ideal circuit components. The results confirmed that all the high-level modulation digital schemes listed above can be produced using the schemes described.

The arrangement in FIG. 1 was realised using commercially available components. FIGS. 14a and 14b show the measured phase states for QPSK and 8 QAM operation. The maximum output power deviation is 0.47 dB, and the maximum phase error 3°.

Simulation was also used to investigate the effects of non-linear amplification. The model used was an RFIC IQ Modulator power amplifier, taken from the ADS example library. This model allows for most of the major dominant factors that reduce linearity to be taken into account, e.g. third order intercept point, gain saturation, harmonic generation, etc.

Figure 14:
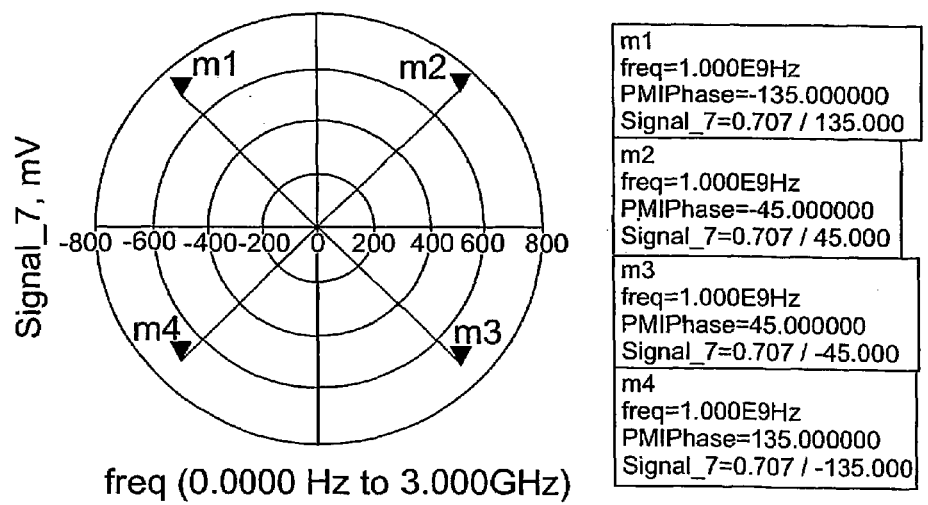
FIG. 14 is a phase diagram showing the output of a simulation of the embodiment of FIG. 1 using amplifiers operating in linear mode.
Figure 15:
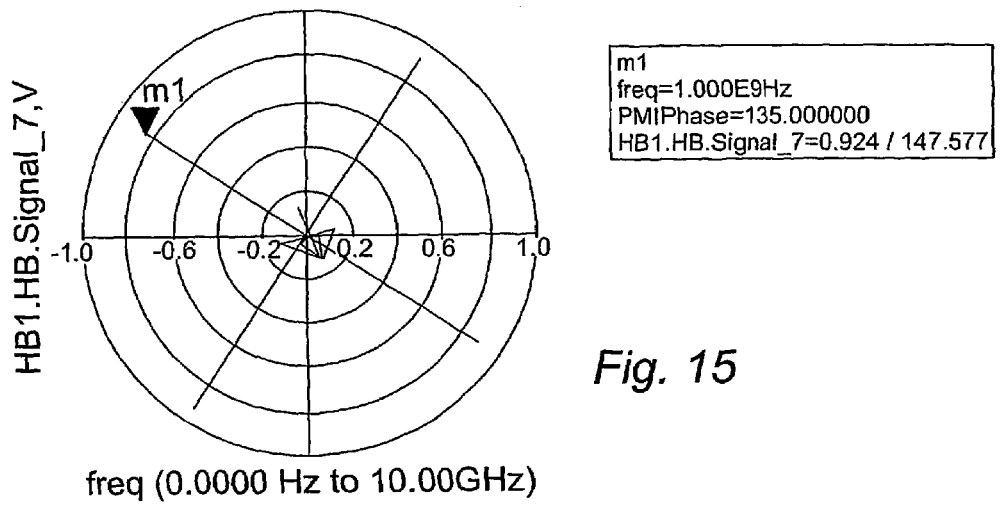
FIG. 15 shows the output of a similar simulation but with non-linear amplifiers.
Figure 14A:
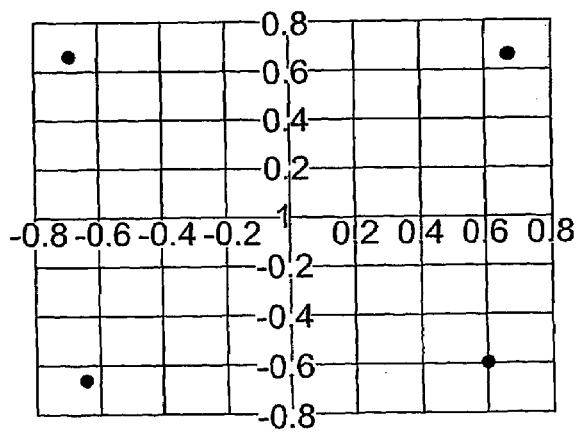
FIGS. 14a and 14b show measured phase states for the arrangement of FIG. 1.
Figure 14B:
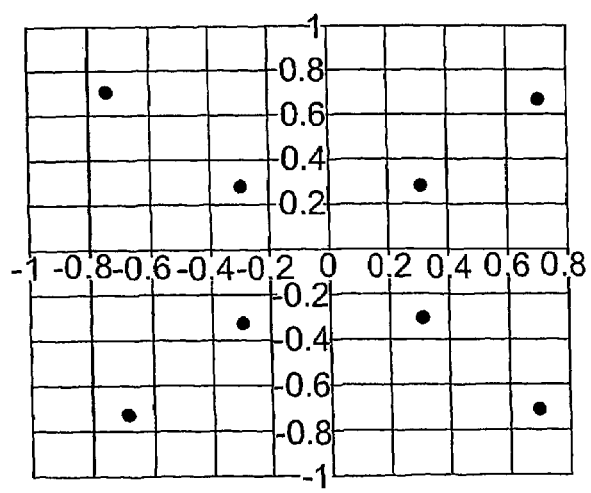

FIG. 14 is a simulated phase diagram for a QPSK system using the scheme of FIG. 1, with linear amplification. FIG. 15 shows the equivalent phase diagram for the non-linear simulation. It can be seen that there are two main effects due to the inclusion of the non-linear PA. One is the generation of harmonics, which can be seen in the centre of the polar diagram, while the group delay of the PA has turned the whole diagram around the centre. The latter effect is not really a problem, as usually the receiver does not require an absolute phase reference for signal recovery. In practice, any phase shifts introduced by the PAs can be accounted for by introducing equalizing phase shift, e.g. by means of a transmission line placed immediately in front of each of the amplifiers in FIG. 1, FIG. 6, FIG. 7.

Figure 16:
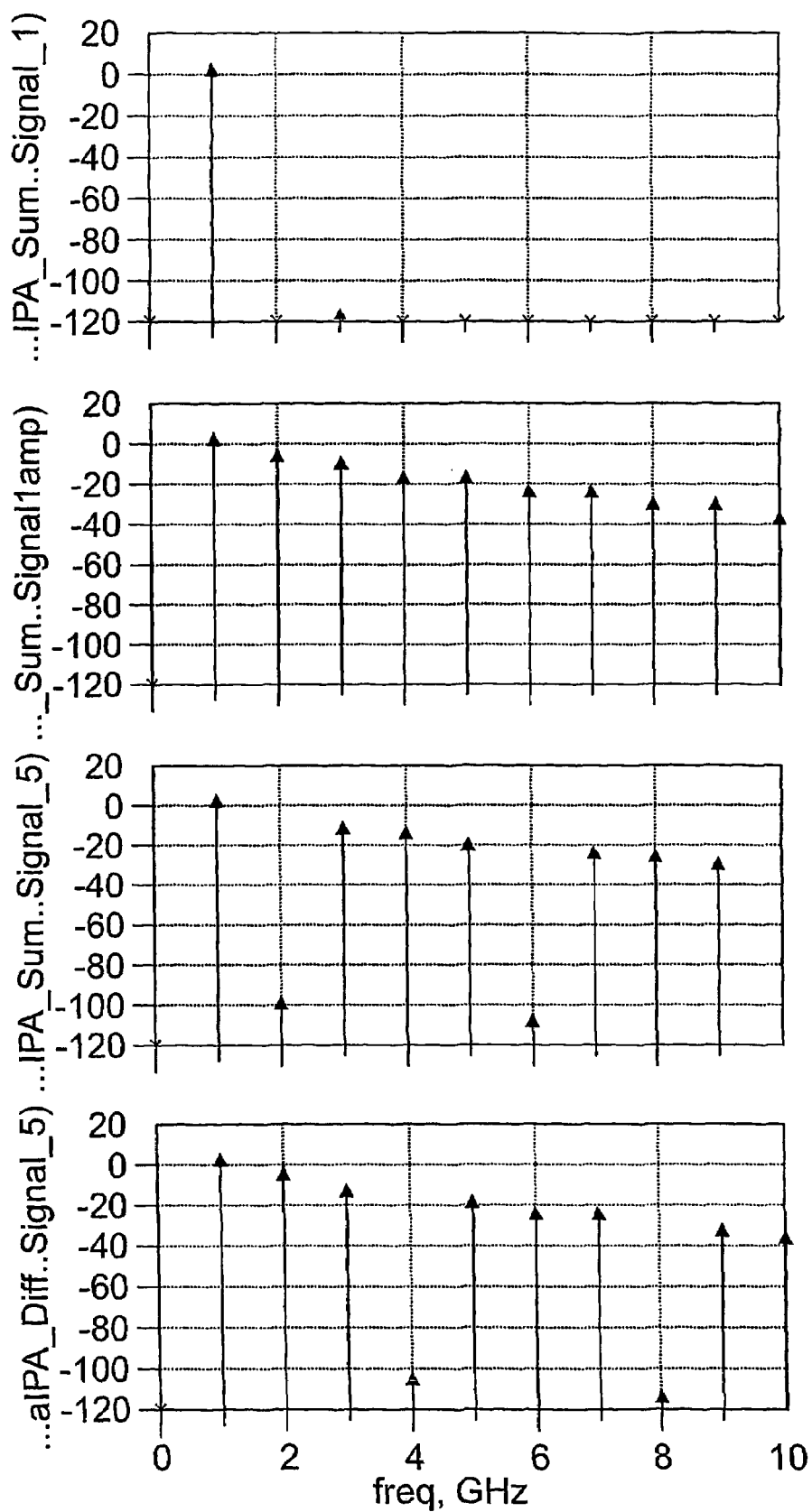
FIG. 16 shows harmonic content at various points in the simulated circuit of FIG. 15.

FIG. 16 shows the spectra on four different positions in the circuit. The uppermost spectrum is taken directly before the PA, showing the spectral clarity of the input signal with all harmonics about 100 dB below carrier (signal 1 in FIG. 1). The second plot shows the spectrum directly after the PA, which has driven into saturation during the simulation resulting in a significant number of strong harmonics (signal 1' in FIG. 1). The third diagram shows the combined signals 1' and 3' from the upper branch of the system (signal 5 in FIG. 1). It can be seen that every second even harmonic, starting with the second one, i.e n=2, 6, 10 . . . , has been cancelled out upon recombination. The lower diagram finally shows the spectrum that results when signal 1' is subtracted from the signal 3' rather than combined with it. It can be seen that again every second even harmonic starting with the 4$^{th}$ one, i.e n=4, 8, 12 . . . , has been cancelled. This cancellation effect upon subtraction is in line with that predicted by Cox [2].

As can be seen, by adding the signals, some of the harmonics including the second one are balanced out. Now given that the third harmonic would typically be outside the bandwidth of most antennas, little or even no RF filtering would be required for the given system.

Thus, it is seen that strong harmonic production in the amplifiers due (in this case) to their forced working in a non-linear regime does not significantly affect the overall linear output performance of the system. This opens up the way for the use of highly efficient highly non-linear (i.e. DC to RF efficient) amplifiers such as a class E (85% efficiency) [7] in the system.

4 Comparison with Prior Art

4.1 Classic Linear Transmitter Topologies

4.1.1 Superheterodyne Transmitters

In modern communications systems that require a high degree of linearity, modulation usually takes place at a low frequency, and once modulated, the signal is up converted to the RF frequency then amplified using a linearised amplifier. Since with this strategy the amplifiers have to be highly linear, they have an inherently low DC to RF efficiency which makes them inefficient for mobile communications applications.

A review of the efficient linear transmitter schemes (all without integrated modulators) is given in [8]. These are briefly summarised below to better set our work in context.

4.1.2 Feedback Transmitter

These are linear amplifier structures where a small part of the radiated signal is demodulated locally the transmitter. In a second step, information about the amplifier's non-linearities gained from this demodulated control signal is then used to modify the input signal and/or make corrections to the settings of the power amplifier section in order to increase linearity of the power amplification. Two popular methods are the Cartesian feedback loop, and the adaptive pre-distortion amplifier [8].

While the feedback systems have shown the potential to use amplifiers with significantly reduced linearity, and hence high DC to RF efficiency, they however all suffer from one inherent disadvantage, which is the inevitable feedback loop with high loop gain, this arrangement makes this class of power amplifiers highly susceptible to oscillations [8].

The system of the invention does not require feedback for its operation, also, unlike the above, modulator and transmitter functions are combined and are digital modulation scheme independent.

4.1.3 LINC Structures

The idea here is to use two highly efficient amplifiers each amplifying a constant envelope phase modulated signal, which are subsequently combined to give an AM, or a PM signal. First introduced by Cox in 1974 [2], his initial idea suffered from a complexity of realisation, and soon further advances were made, e.g. [9], [10]. The current approach is to obtain the required phase conjugated signals through DSP methods to avoid the problems of the complex LINC hardware structure proposed by Cox [2]. This approach however is limited to low data rates due to DSP processor limitations.

While the work presented here follows the same basic principle of using constant amplitude signals during amplification, there are however significant differences in that first we do not produce AM and PM signals, second the modulation process takes place at the RF frequency, making the up-converters redundant, and third the inherent properties of either a mixer or a See-Saw modulator are used to create the phase conjugated signals, hence removing the need for large "signal separation" circuitry that was required by Cox. Furthermore, by using two separate amplifier chains in quadrature to each other, we gain the possibility to create any given modulation scheme just by choosing different phase angles for two phase modulators. This aspect has not been addressed previously. The problem of integral up conversion and adaptive modulation have to date been partly addressed, [12]. The architecture in [12] represents a very complex solution and is considerably less flexible than the one suggested here, since it requires the use of injection locked oscillators and a complex matrix switch arrangement for its operation.

With our system, in order to create any of the above given modulation schemes, only the phase angles of the input phase shifters have to be preset to a finite number of possible phase states. Consequently, this suggested topology allows for the first time the creation of a true digital multimode modulator/transmitter that can be switched between any of the commonly used data communication modulation schemes without having sophisticated hardware or DSP incorporated.

Additionally, a second technique using a See-Saw modulator was introduced. In this case, shorted lines switched by PIN diodes are used to create the necessary phase shifts and conjugated signals. While this technique lacks the total flexibility of the initial concept, it nevertheless introduced a very simple way to create the necessary phase modulated signals without the need of doublers or mixers and would be exceptionally useful in all wireless frequency bands, especially those associated with millimetre-wave broadband wireless systems where the arrangement suggested could easily be implemented in MMIC form.

4.2 Modulators

The state-of-the-art approach to any of the above mentioned modulation schemes is to have a baseband modulator, which is tailor-made for the specific modulation scheme in question. The baseband signal is then up converted to the RF frequency, linearly amplified, and transmitted. While it is known that in principle a linear IQ modulator [11] can create any output phase and amplitude, such a universal device embodying inherent up conversion has not yet been realised. Therefore a freely definable IQ modulator/high frequency transmitter was until now thought to be too complicated to be of practical value.

In contrast, the approach in our work uses simple phase shifters to create the correct phase vector component used to synthesise the digital modulation states directly at the RF carrier frequency. This eliminates the need for D/A converters and sophisticated DSP, and keeps the modulators simple enough to work directly at the RF band, therefore removing the need for up conversion required by classical systems.

4.3 Parallel Amplification

In the present system, because the in-phase and the quadrature part of the signal are kept separate until the very last stage, they can actually be amplified independently prior to combination. The system can if required be made maximally efficient by including a power factor correction feature into the combination circuitry. This means that each of the four power amplifiers in each of the four signal paths have to achieve significantly less output power than a single power amplifier would have to achieve in a classic, single path topology. As it is much easier to build several power amplifiers for relatively low power levels than building a single amplifier for high power, this is a significant advantage of the proposed system over classic approaches.

In addition, these amplifiers can be highly nonlinear without impairing overall quality of the modulation produced.

For some applications, the classic power amplifier cannot be built with a single device because the device cannot handle the currents required to achieve the desired output power. Many classic amplifiers will actually consist of several devices used in parallel. In addition to the required splitters, additional control circuitry is required for amplifier linearisation.

However, there is one disadvantage of our proposed system over a classic power amplifier, which is that for high order modulation schemes the maximum RF output power is not twice the output power of one branch of the system. The reason is that the most efficient way to combine signals would be to combine them in-phase, not in quadrature. Especially, for signals that have a phase angle which is close to a multiple of 90°, either the in-phase or the quadrature path contributes very little to the overall output power which is left to the other path. This phenomenon is smallest for QPSK or BPSK, and becomes more dominant for the higher the modulation order schemes, i.e. worst for 16 PSK and 16 QAM. However, this phenomenon is likely to be compensated for by the fact that the requirements for the linearity of the power amplifiers is made redundant thereby allowing for them to be driven very hard and to operate very effectively.

4.4 Linearisation Requirements for QAM

Classic solutions for QAM signals have to be highly linear, as the amplitude of the signal contains modulation information. This puts particularly critical requirements on the final power amplifier, which has to achieve high output power levels and high linearity, while simultaneously being energy efficient to secure sufficient battery life for mobile unit operation. Unfortunately, the most energy efficient operating modes for power amplifier are also the most non-linear ones, and hence much more suitable to constant envelope signals. Due to these restrictions, classic amplifier solutions always have to compromise efficiently for linearity to some degree.

In the system proposed here, the in-phase and quadrature signals are each phase modulated and consequently have constant envelope during amplification. Hence, the power amplifiers for the system suggested here can work in their highly efficient non-linear region without compromising signal integrity.

Additionally, as predicted by Cox [2], some of the harmonics generated in each of the branches are in antiphase, and others in phase, with respect to the other branch. As a result, when the signals are combined, cancellation takes place, actively increasing the linearity of the system.

4.5 Summary

Systems embodying the invention have the following advantages over classic topologies:

High flexibility; any of the commonly used digital modulation schemes can be implemented without changing the hardware, thus yielding a major step towards a software-reconfigurable digital radio.

The core of the system can be easily modified for analogue AM or FM modulation.

Constant envelope signal during amplification phases results in
  High linearity
  Simple nonlinear amplifiers
  High DC to RF efficiency
  Inherent cancellation of some of the harmonics, i.e., the system is actively increasing linearity
  No feedback loop removes risk of oscillations
  Low component count compared to standard LINC technology. No DSP, hence no sample rate and aliasing problems, or A/D converters needed, and enhanced flexibility in types of modulation schemes produced

REFERENCES

[1] P. B. Kenington: "Emerging technologies for software radio", IEE Electronics & Communication Engineering Journal, April 1999, pp. 69-83

[2] D. C. Cox: "Linear Amplification with Nonlinear Components", IEEE Transactions on Communications, December 1974, pp 1942-1945

[3] S. A. Maas: "The RF and Microwave Circuit Design Cookbook", Artech House, Norwood, 1998, pp 236-240

[4] J. A. Navarro, K Chang: "Integrated Active Antennas and Spatial Power Combining", Wiley, 1996

[5] S. Foti, R Cahill, C. Kaniou: "See Saw phase shifter cuts cost of phased array", Microwaves & RF, March 1987, pp 69-77

[6] "Advanced Design System", Version 1.5, Agilent Technologies, 2000

[7] F Raab: "Class-E, Class-C and Class-F power amplifiers based upon a finite number of harmonics", IEEE Trans. MTT, Vol 49, No 8, August 2001, pp 1462-1468

[8] S. Mann, M. Beach, P. War, J McGeechan: "Increasing the Talk-Time of Mobile Radios with efficient linear Transmitter Architectures", Electronics and Communications Engineering Journal, April 2001, pp 65-76

[9] A. Bateman, D. M. Haines, and R. J. Wilkinson: "Linear Transceiver Architectures", IEEE Vehicular Technology Conf., May 1988, pp 478-484

[10] S. A. Hetzel, A. Bateman, and J P McGeechan: "LINC Transmitter", Electronics Letters, May 1991, Vol 27, No 10, pp 844-846

[11] W. Tomasi: "Electronic Communications Systems", Prentice Hall, Inc., Englewood Cliffs, 1988

[12] D J Jennings, J P McGreehan: "A high-Efficiency RF Transmitter using VCO-derived Synthesis: CALLUM, IEEE Trans. MTT, Vol 47, No 6, June 1999, pp 715-721

The invention claimed is:

1. A method for providing an amplified modulated radio frequency signal, the method comprising:
   providing a radio frequency (RF) oscillatory signal;
   providing an input signal;
   modulating said RF oscillatory signal with the input signal to provide a modulated RF signal, splitting the modulated RF signal into a first modulated RF signal and a second modulated RF signal, combining the second modulated RF signal with a frequency multiple of the RF oscillatory signal to provide a composite RF signal, the first modulated RF signal and the composite RF signal forming a pair of phase modulated phase conjugated signals; and
   summing said pair of signals to provide the desired modulated RF signal output.

2. The method of claim 1, wherein each of the first modulated RF signal and the composite RF signal is separately amplified before being summed with the other.

3. The method of claim 2, wherein the amplification is non-linear.

4. The method of claim 1, wherein said, frequency multiple is 2.

5. The method of claim 1, wherein said frequency multiple of the RF oscillatory signal is produced from the RF oscillatory signal by a frequency multiplier or by use of a harmonic mixer.

6. The method of claim 1, wherein the input signal is an analogue signal and said modulation is an analogue phase shift.

7. The method of claim 6, wherein the result of the summation is an amplitude modulated RF signal.

8. The method of claim 7, wherein the amplitude modulated signal may be further summed with said RF oscillatory signal to provide a frequency modulated RF signal.

9. The method of claim 1, wherein the input signal comprises in-phase (I) and quadrature (Q) input signals which are digitally modulated.

10. The method of claim 9, wherein each of the I and Q signals is processed in a respective channel.

11. The method of claim 10, wherein the channel outputs are summed.

12. The method of claim 10, wherein the channels share an RF oscillatory signal, which is phase shifted by 90 degrees within the Q channel.

13. A modulator for generating a modulated RF signal, the modulator comprising:
   a local oscillator generating an RF oscillatory signal;
   means for producing, from said RF oscillatory signal and an input signal, a pair of phase modulated phase conjugated signals comprising a modulator arranged to modulate said RF oscillatory signal with the input signal to provide a modulated RF signal,
   a splitter arranged to split the modulated RF signal into a first modulated RF signal and a second modulated RF signal,
   a mixer connected to mix said second modulated RE signal with a frequency multiple RF oscillatory signal to provide a composite RF signal, the first modulated RE signal and the composite RE signal forming the pair of signals; and
   a summing circuit receiving said pair of signals as inputs to generate a modulated RF output signal as its output.

14. The modulator of claim 13, wherein a first amplifier is connected between the mixer output and respective input of the summing circuit, and a second amplifier is connected between the modulator output and a respective input of the summing circuit.

15. The modulator of claim 13, wherein the mixer is a fundamental mixer and receives the local oscillator output via a frequency multiplier circuit.

16. The modulator of claim 15, wherein the multiplier circuit comprises a frequency doubler.

17. The modulator of claim 14, wherein the mixer is a harmonic mixer connected directly to the oscillator output.

18. The modulator of claim 13, wherein the input signal is an analogue signal and the modulator is an analogue phase shifter.

19. The modulator of claim 18, wherein the output of the summing circuit is an amplitude modulated RF signal.

20. The modulator of claim 19, wherein the modulator includes a further summer which sums the output of the summing circuit with the local oscillator signal to provide a frequency modulated output signal.

21. The modulator of claim 13, wherein the input signal comprises in-phase (I) and quadrature (Q) input signals, which are digitally modulated.

22. The modulator of claim 21, wherein the modulator comprises an I channel and a Q channel, each channel sharing a common local oscillator.

23. The modulator of claim 22, wherein the outputs of the summing circuits of the I and Q channels are combined by a third summer to provide the modulated RF output signal.

24. The modulator of claim 22, wherein each channel comprises a mixer.

25. The modulator of claim 24, wherein the mixers are fundamental mixers supplied with a frequency doubled local oscillator signal.

26. The modulator of claim 24, wherein each channel has its own frequency doubler.

27. The modulator of claim 26, wherein the frequency doubler in the Q channel receives the local oscillator output phase shifted by 90 degrees.

28. The modulator of claim 24, wherein both mixers are supplied by a single frequency doubler.

29. The modulator of claim 28, wherein the signal from the local oscillator to the Q channel modulator is phase shifted by 90 degrees.

30. The modulator of claim 24, wherein the mixers are harmonic mixers.

* * * * *

UNITED STATES PATENT AND TRADEMARK OFFICE
CERTIFICATE OF CORRECTION

PATENT NO. : 7,289,573 B2  Page 1 of 1
APPLICATION NO. : 10/505692
DATED : October 30, 2007
INVENTOR(S) : Fusco et al.

It is certified that error appears in the above-identified patent and that said Letters Patent is hereby corrected as shown below:

Column 16, Claim 13, line 56 - change "RE" to -- RF --

Column 16, Claim 13, line 59 - change "RE" to -- RF --

Signed and Sealed this

Twenty-fifth Day of March, 2008

JON W. DUDAS
*Director of the United States Patent and Trademark Office*